(12) United States Patent
Liu et al.

(10) Patent No.: US 9,673,000 B2
(45) Date of Patent: Jun. 6, 2017

(54) MULTIFUNCTION KEY AND ELECTRONIC DEVICE WITH MULTIFUNCTION KEY

(71) Applicants: SHENZHEN FUTAIHONG PRECISION INDUSTRY CO., LTD., Shenzhen (CN); FIH (HONG KONG) LIMITED, Kowloon (HK)

(72) Inventors: Su-Tzong Liu, New Taipei (TW); Sheng-Ying Liu, Shenzhen (CN); Wei-Rong Xiao, Shenzhen (CN)

(73) Assignees: SHENZHEN FUTAIHONG PRECISION INDUSTRY CO., LTD., Shenzhen (CN); FIH (HONG KONG) LIMITED, Kowloon (HK)

( * ) Notice: Subject to any disclaimer, the term of this patent is extended or adjusted under 35 U.S.C. 154(b) by 70 days.

(21) Appl. No.: 14/755,082

(22) Filed: Jun. 30, 2015

(65) Prior Publication Data
US 2016/0284494 A1    Sep. 29, 2016

(30) Foreign Application Priority Data

Mar. 26, 2015 (CN) .......................... 2015 1 0135555

(51) Int. Cl.
| | |
|---|---|
| *H01C 7/10* | (2006.01) |
| *H01H 15/10* | (2006.01) |
| *H01H 15/00* | (2006.01) |
| *H01H 1/36* | (2006.01) |
| *H03K 17/96* | (2006.01) |

(Continued)

(52) U.S. Cl.
CPC .............. *H01H 15/10* (2013.01); *H01H 1/36* (2013.01); *H01H 15/005* (2013.01); *H03K 17/9625* (2013.01); *H01H 3/0213* (2013.01); *H03K 17/965* (2013.01)

(58) Field of Classification Search
CPC ...... H01H 15/10; H01H 15/005; H01H 1/346; H01H 2205/002
USPC .......... 338/13, 118, 198, 202, 215; 200/252, 200/547–550
See application file for complete search history.

(56) References Cited

U.S. PATENT DOCUMENTS 3,909,770 A * 9/1975 Oka ....................... H01C 10/38
338/119
4,369,424 A * 1/1983 Miyamoto ............. H01C 10/44
200/304

(Continued)

*Primary Examiner* — Kyung Lee
(74) *Attorney, Agent, or Firm* — Steven Reiss

(57) ABSTRACT

A multifunction key includes a key member, a conductive member, and a circuit baseboard. A portion of the key member extends out from a shell of an electronic device; the conductive member is fixed on a bottom of the key member. The conductive member includes a first protrusion member and a second protrusion member. One surface of the circuit baseboard includes a conductive layer and a resistance layer respectively contacting the first and the second protrusion member. Another surface of the circuit baseboard includes a first and second conductive terminal respectively connected to the conductive layer and the resistance layer. The conductive layer, resistance layer, first and second conductive terminal, conductive member, and an internal circuit of the electronic device form a circuit loop. When the key member moves, a resistance value of the resistance layer within in the circuit loop is changed and produces a corresponding key command.

15 Claims, 12 Drawing Sheets

(51) Int. Cl.
*H01H 3/02* (2006.01)
*H03K 17/965* (2006.01)

(56) References Cited

U.S. PATENT DOCUMENTS

| | | | | |
|---|---|---|---|---|
| 5,672,854 | A * | 9/1997 | Nishio | H01H 9/38 200/16 R |
| 5,840,255 | A * | 11/1998 | Kappel | G01N 27/12 338/34 |
| 6,130,600 | A * | 10/2000 | Wu | H01C 10/30 338/118 |
| 6,359,545 | B1 * | 3/2002 | Bressers | H01C 10/30 338/160 |
| 6,794,984 | B2 * | 9/2004 | Komatsu | H01R 39/24 338/118 |
| 7,710,237 | B2 * | 5/2010 | Kato | H01C 10/14 200/252 |
| 2003/0010917 | A1 * | 1/2003 | Parsons | H01L 31/0256 250/338.1 |

* cited by examiner

| Resistance value R | Key command |
|---|---|
| R<Ra | First key command |
| Ra≤R<Rb | Second key command |
| Rb≤R<Rc | None |
| Rc≤R<Rd | Third key command |
| Rd≤R | Fourth key command |

FIG. 5

MULTIFUNCTION KEY AND ELECTRONIC DEVICE WITH MULTIFUNCTION KEY

CROSS-REFERENCE TO RELATED APPLICATION

This application claims priority to Chinese Patent Application No. 201510135555.1 filed on Mar. 26, 2015, the contents of which are incorporated by reference herein.

FIELD

The subject matter herein generally relates to keys, and particularly to a multifunction key and an electronic device with the multifunction key.

BACKGROUND

Electronic devices, such as mobile phones, tablet computers, usually employ a touch screen as the input/output mechanism. In order to control the electronic device more conveniently, one or more mechanical keys are also installed at a sidewall or other places of the electronic devices.

BRIEF DESCRIPTION OF THE DRAWINGS

Implementations of the present technology will now be described, by way of example only, with reference to the attached figures.

FIG. 5 is a diagrammatic view of a resistance value range and key command relationship table.

DETAILED DESCRIPTION

Figure 1:
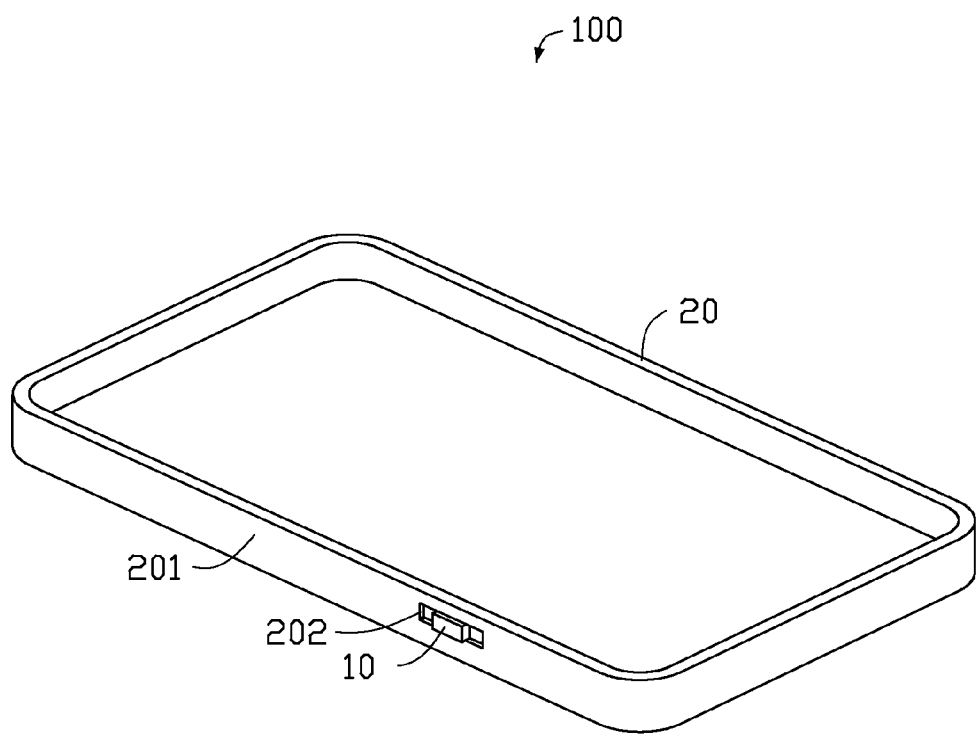
FIG. 1 is an isometric view of a shell of an electronic device with a multifunction key.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The connection can be such that the objects are permanently connected or releasably connected.

Figure 2:
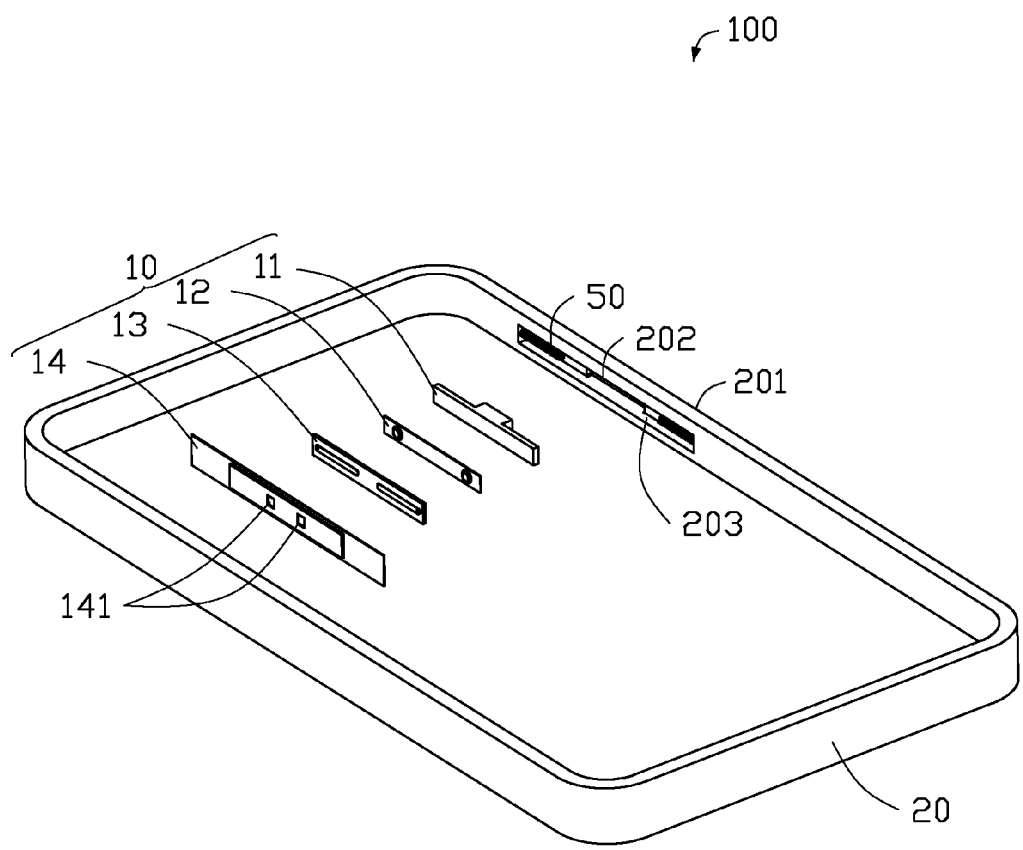
FIG. 2 is an exploded view of the multifunction key of the electronic device of FIG. 1.

FIGS. 1 and 2 illustrate an electronic device 100 includes a multifunction key 10 (hereinafter, the key 10) and a shell 20. The key 10 is installed on a sidewall 201 of the shell 20 and is used to provide various key commands.

Figure 3:
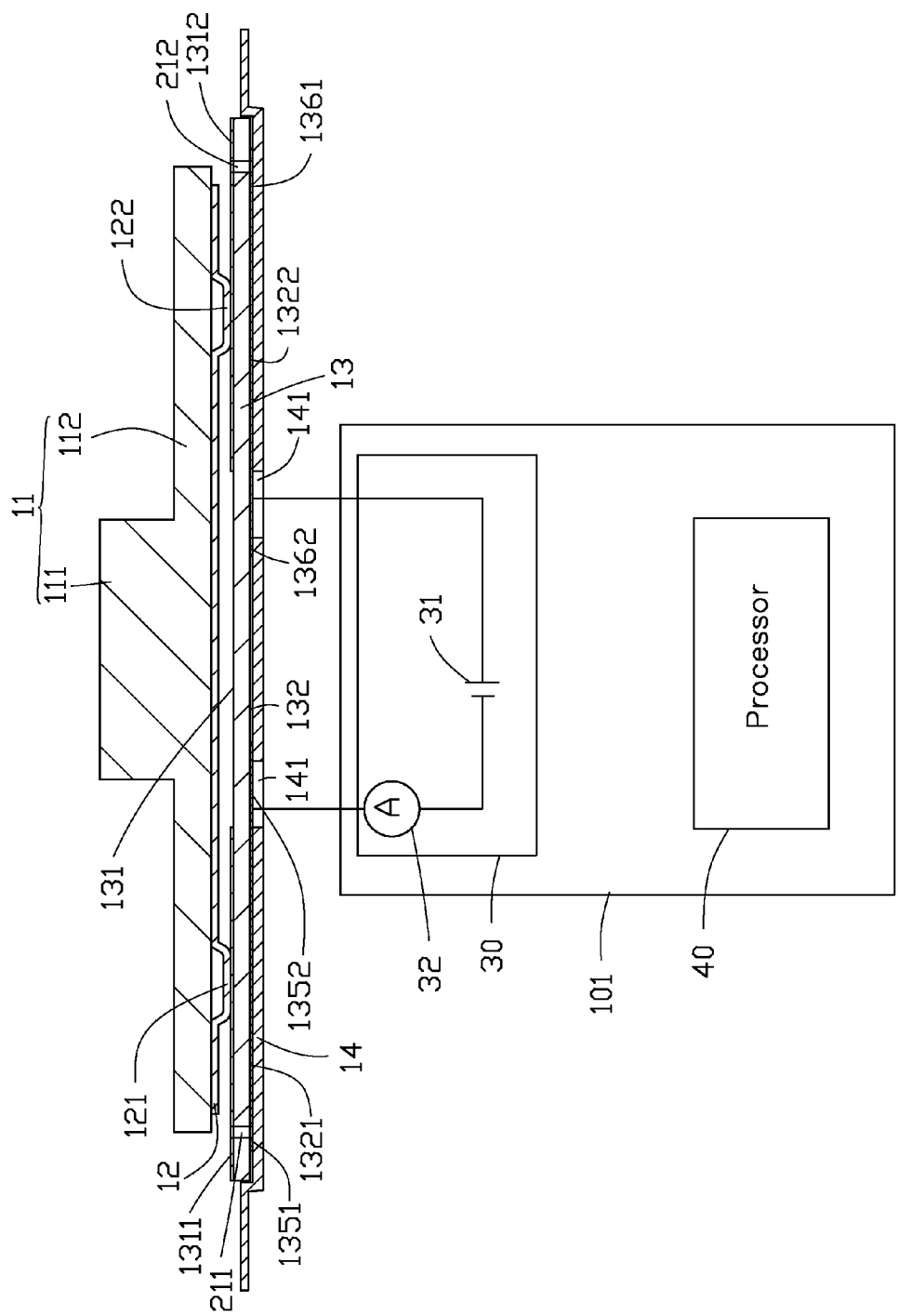
FIG. 3 is a diagrammatic view of the multifunction key of the electronic device of FIG. 1.

FIG. 3 illustrates the key 10 includes a key member 11, a conductive member 12, and a circuit baseboard 13. A portion of the key member 11 is exposed on an outside of the shell 20. The conductive member 12 is fixed on a bottom (namely, the surface is not exposed on the outside of the shell 20) of the key member 11, and includes a first protrusion member 121 and a second protrusion member 122 extending toward a direction away from the bottom of the key member 11. In the embodiment, the conductive member 12 is a rectangular conductive strip, and the first protrusion member 121 and the second protrusion member 122 are respectively formed by curving two portions nearing two ends of conductive member 12 along the direction away from the bottom of the key member 11. In another embodiment, the first protrusion member 121 and the second protrusion member 122 can be two conductive poles extending from the two portions nearing two ends of the conductive member 12.

The circuit baseboard 13 includes a first surface 131 and a second surface 132 opposite to the first surface 131.

FIG. 3 illustrates the first surface 131 includes a first conductive layer 1311 and a resistance layer 1312 which are spaced apart and electrically isolated from each other on the first surface 131. The first surface 131 faces the conductive member 12. The first conductive layer 1311 and a resistance layer 1312 are respectively electrically connected to the first protrusion member 121 and the second protrusion member 122. In one embodiment, the conductive layer 1311 and the resistance layer 1312 are two separated coatings coated on the first surface 131 of the circuit baseboard 13. In one embodiment, the circuit baseboard 13 is shaped as rectangle and is made of insulating materials, such as resin material. The conductive layer 1311 is coated on substantially half an area of the first surface 131 of the circuit baseboard 13, and the resistance layer 1312 is coated on another substantially half the area of the first surface 131 of the circuit baseboard 13, and a portion of the first surface 131 between the conductive layer 1311 and the resistance layer 1312 is not coated by the conductive layer 1311 and the resistance layer 1312. In another embodiment, the conductive layer 1311 and the resistance layer 1312 are two rectangle strips fixed on the first surface 131 and separate from each other.

The first protrusion member 121 and the second protrusion member 122 of the conductive member 12 respectively contact with the first conductive layer 1311 and the resistance layer 1312 and electrically connect to the first conductive layer 1311 and the resistance layer 1312. The conductive member 12 can move along a direction parallel to an arrangement of first conductive layer 1311 and the resistance layer 1312, namely the conductive member 12 can move along lengthwise directions of the circuit baseboard 13 and the sidewall 201. The first protrusion member 121 and the second protrusion member 122 always respectively make contact with the first conductive layer 1311 and the resistance layer 1312 when the conductive member 12 is moved.

The second surface 132 of the circuit baseboard 13 includes a first conductive terminal 1321 and a second conductive terminal 1322, a first end 1351 of the first conductive terminal 1321 is electrically connected to the conductive layer 1311 via a first conductive hole 211 passing through the circuit baseboard 13. In the embodiment, the first conductive hole 211 is located on an end of the circuit baseboard 13 and penetrates the circuit baseboard 13 and electrically connects the first end 1351 of the first conductive terminal 1321 and the conductive layer 1311. A first end 1361 of the second conductive terminal 1322 is electrically connected to the resistance layer 1312 via a second conductive hole 212. In the embodiment, the second conductive hole 212 is located on another end of the circuit baseboard 13 and penetrates the circuit baseboard 13 and electrically connects the first end 1361 of the second conductive terminal 1322 and the resistance layer 1312.

A second end 1352 of the first conductive terminal 1321 and a second end 1362 of the first conductive terminal 1322 are electrically connected to an internal circuit 101 of the electronic device 100. In one embodiment, the internal circuit 101 of the electronic device 100, the conductive layer 1311, and the resistance layer 1312 form a circuit loop C1 via the first conductive terminal 1321, the second conductive terminal 1322, the first conductive hole 211, the second conductive hole 212, and the conductive member 12.

Figure 4:
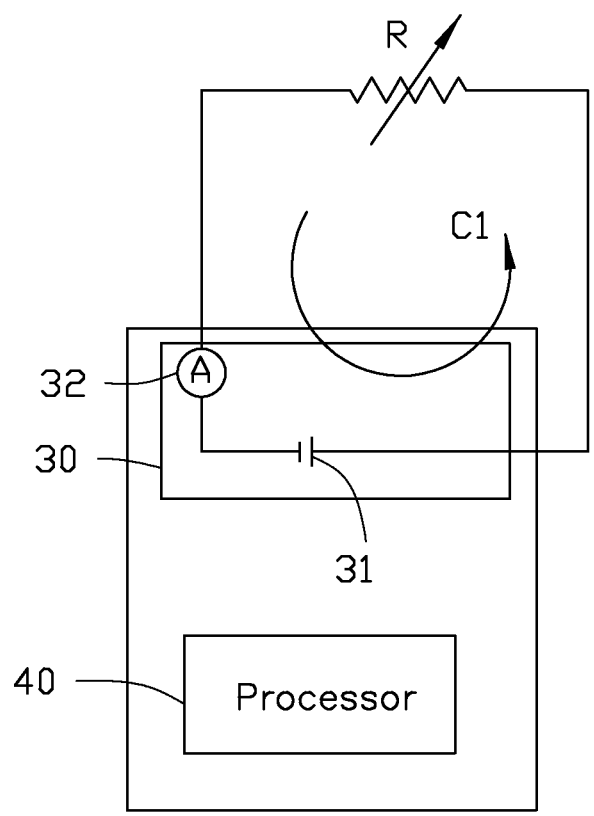
FIG. 4 is an equivalent circuit diagram of a circuit loop formed in the multifunction key of the electronic device of FIG. 1.

FIG. 4 illustrates an equivalent circuit diagram of the circuit loop C1. Assuming a resistance value of the resistance layer 1312 within the circuit loop C1 is R, when the key member 11 moves along the direction of arrangement of the conductive layer 1311 and the resistance layer 1312, the conductive member 12 fixed on the bottom of the key member 11 moves too, thus causing a distance between the second protrusion member 122 and the second conductive hole 212 to be changed. Accordingly, a length of the resistance layer 1312 between the second protrusion member 122 and the second conductive hole 212 is changed, and the resistance value of the resistance layer 1312 within the circuit loop C1 is changed, thus triggering the electronic device 100 to produce different key commands corresponding to different resistance values of the resistance layer 1312 within the circuit loop C1.

In the embodiment, the conductive layer 1311, the first conductive terminal 1321, the second conductive terminal 1322, the first conductive hole 211, the second conductive hole 212, and the conductive member 12 are all made of materials with high conductivity (for example, $5 \times 10^7$ (S/cm)) and near zero resistance value (effectively zero resistance for purposes herein), such as silver, copper, etc. The resistance layer 1312 is made of materials with low conductivity (for example, $5 \times 10^3$ (S/cm)), such as a carbon film. In another embodiment, the conductive layer 1311 can be a thick coating and the resistance layer 1312 can be a thin coating, and the conductive layer 1311 and the resistance layer 1312 are made of the same material, such as iron. Therefore, resistance values of the conductive layer 1311, the first conductive terminal 1321, the second conductive terminal 1322, the first conductive hole 211, the second conductive hole 212, and the conductive member 12 are very small and can be omitted. The resistance value R of the resistance layer 1312 within in the circuit loop C1 can be considered as equal to a resistance value of the circuit loop C1. Hereinafter, the resistance value of the resistance layer 1312 within in the circuit loop C1 and the resistance value of the circuit loop C1 are all represented as "R".

In one embodiment, the internal circuit 101 includes a power supply and detection unit 30, and the processor 40. The second end 1352 of the first conductive terminal 1321 and the second end 1362 of the second conductive terminal 1322 are electrically connected to the power supply and detection unit 30. The power supply and detection unit 30, the conductive layer 1311, and the resistance layer 1312 form the circuit loop C1 via the first conductive terminal 1321, the second conductive terminal 1322, the first conductive hole 211, the second conductive hole 212, and the conductive member 12. The power supply and detection unit 30 is used to provide a predetermined voltage V1 to the loop circuit C1, and detect a current value of the circuit loop C1.

The processor 40 is connected to the power supply and detection unit 30, and is used to obtain the current value detected by the power supply and detection unit 30, and determine the resistance value of the circuit loop C1 according to Ohms law. The processor 40 further determines and/or produces a key command corresponding to the determined resistance value R, and executes the key command.

In the embodiment, the processor 40 determines the key command corresponding to the resistance value R of the circuit loop C1 according to a resistance value range and key command relationship table T1 as shown in FIG. 5, and executes the determined key command. Because the predetermined voltage is a constant value, when the resistance value R of the circuit loop C1 is changed, the current value of circuit loop C1 is changed. The processor 40 determines the resistance value R of the circuit loop C1 according to the predetermined voltage and the current value, and determines which resistance value range the current resistance value R of the circuit loop C1 is within, and then determines the corresponding key command according to the resistance value range and key command relationship table.

In detail, as shown in FIG. 3, the power supply and detection unit 30 includes a power source 31 and a current sensor 32. The power source 31 is used to provide the predetermined voltage and the current sensor 32 is used to detect the current value of the circuit loop C1. The processor 40 is connected to the current sensor 32 and obtains the current value detected by the current sensor 32, the predetermined voltage can be pre-stored in the processor 40. In the embodiment, the power source 31 can be a battery or a battery pack, and the current sensor 32 can be a current meter.

FIG. 5 illustrates the resistance value range and key command relationship table T1. As shown in FIG. 5, the resistance value range and key command relationship table T1 records relationships between a number of resistance value ranges and a number of key commands. As described above, the resistance value of the circuit loop C1 is equal to the resistance value of the resistance layer 1312 within the circuit loop C1 and are both represented as R. When the resistance value R is less than a first predetermined resistance value Ra, the corresponding key command is a first key command. When the resistance value R is not less than the first predetermined resistance value Ra and less than a second predetermined resistance value Rb, the corresponding key command is a second key command. When the resistance value R is not less than the second predetermined resistance value Rb and less than a third predetermined resistance value Rc, the corresponding key command is none, namely no key command is produced when the resistance value R is not less than the second predetermined resistance value Rb and less than the third predetermined resistance value Rc. When the resistance value R is not less than the third predetermined resistance value Rc and less than a fourth predetermined resistance value Rd, the corresponding key command is a third key command. When the resistance value R is not less than the fourth predetermined resistance value Rd, the corresponding key command is a fourth key command.

Figure 6:
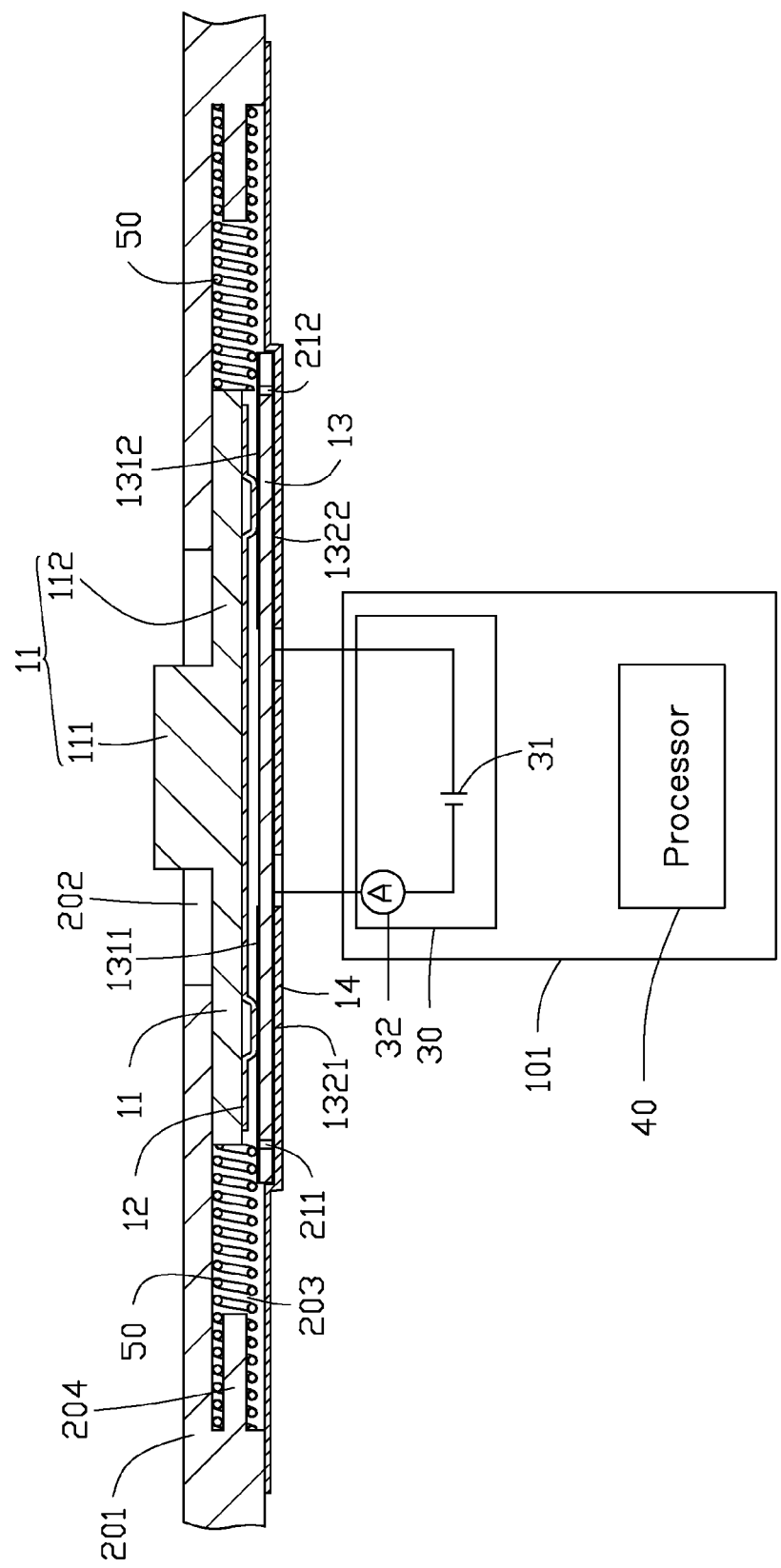
FIG. 6 is a diagrammatic view showing a multifunction key being received in inner sidewall of the shell of the electronic device of FIG. 1.

FIG. 6 illustrates the sidewall 201 of the shell 20 of the electronic device 100 includes an opening 202, and an inner sidewall of the opening 202 defines two receiving slots 203 extending toward two opposite directions along the lengthwise of the sidewall 201 of the shell 20.

The key member 11 includes a keycap and a base body 112 fixed to each other. The base body 112 is rectangle shaped and two ends of the base body 112 are respectively received in the two receiving slots 203. The keycap is fixed on a center of the base body 112 and is extended out from the opening 202. The keycap is provided for the user to operate. The keycap 111 and the base body 112 forms the key member 11 with an inverted "T" shape. The conductive member 12 is fixed on a bottom of the base body 112, namely a surface of the base body 112 does not connect to the keycap. In one embodiment, the keycap 111 can be a cylinder or an elliptic cylinder.

A size of the keycap 111 is less than that of the opening 202, and a length of the base body 112 is less than a total length of the two receiving slots 203. The keycap 111 can bring the base body 112 to move in the two receiving slots 203 in response to user operation, thus driving the conductive member 12 to move to different positions along the lengthwise direction of the sidewall 201 to trigger different key commands.

That is, when the conductive member 12 moves along the lengthwise direction of the sidewall 201, the first protrusion member 121 and the second protrusion member 122 of the conductive member 12 are moved relative to the conductive layer 1311 and the resistance layer 1312 of the circuit baseboard 13. Resistance layer 1312 provides a resistance value within the circuit loop C1 based on the distance between protrusion member 122 and second conductive hole 212; such that movement of conductive member 12 causes that resistance value to change (preferably proportionally to the distance, although that need not be the case). Accordingly, the resistance value of the circuit loop C1 is changed, thus triggering the key command corresponding to the resistance value to be generated.

Referring now to FIG. 6, the electronic device 100 may also include two elastic members 50. The two elastic members 50 are respectively received in the two receiving slots 203 and each elastic member 50 is set between one corresponding end of the base body 112 and a bottom of one corresponding receiving slot 203. In one embodiment, the elastic members 50 are coil springs, a support pole 204 is set at the bottom of each receiving slot 203 extending from the bottom of the receiving slot 203. Each elastic member 50 is set around the corresponding support pole 204 and is limited to be between the corresponding end of the base body 112 and the bottom of the corresponding receiving slot 20. In another embodiment, the support pole can be omitted, and two ends of each elastic member 50 are respectively fixed on the corresponding end of the base body 112 and the bottom of the corresponding receiving slot 20. In yet another embodiment, each elastic member 50 can be a folded spring.

FIG. 6 illustrates in the embodiment, the two elastic members 50 are substantially the same, when the key member 11 is not operated by the user, the two elastic members 50 do not produce elastic forces or produce offsetting elastic forces, thus causing the key member 11 to retain on a center position of the opening 202, namely the key member 11 is at an initial position. When the key member 11 moves along the lengthwise direction of the sidewall 201 in response to user operations, one elastic member 50 is depressed and another elastic member 50 is stretched. When the key member 11 stops being operated by the user, the two elastic members 50 produce corresponding elastic forces to force the key member 11 to resume the initial position.

Figure 7:
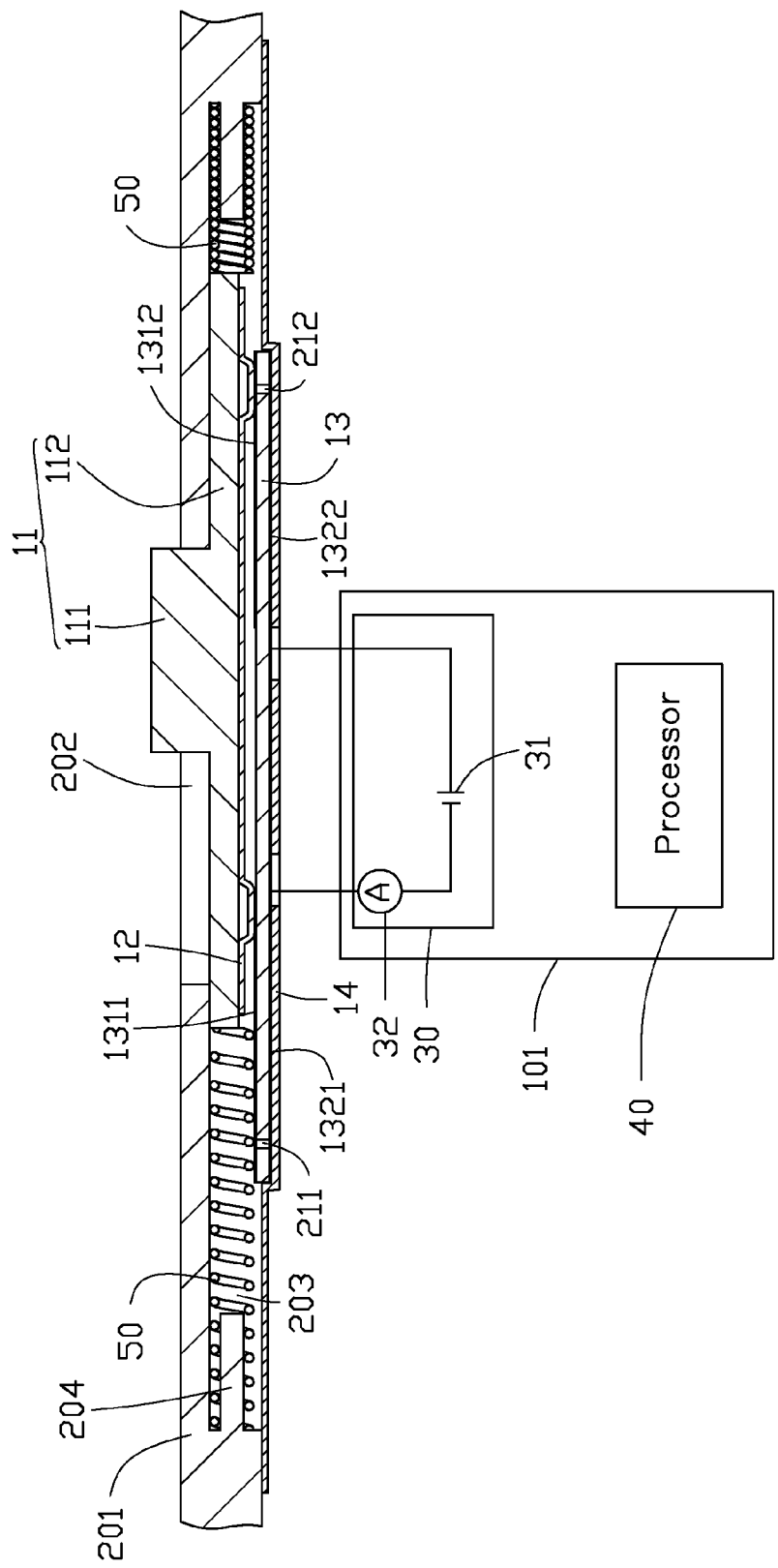
FIG. 7 is a diagrammatic view showing a key member of a multifunction key moved to a first position.

FIGS. 7-11 illustrate different positions the key member 11 moves to. Assuming a maximum distance that the key member 11 moves from the initial position to the a position that contacts to an edge of the opening 202 is L, namely, the maximum distance that the key member 11 is pushed from the initial position to end is L. When the key member 11 is pushed to the end toward right (as shown in FIG. 7), namely, the key member 11 is pushed from the initial position toward the second conductive hole 212 for the maximum distance L, a distance between the second protrusion member 122 of the key member 11 and the second conductive hole 212 is L1 as shown in FIG. 7, and a resistance value of the resistance layer 1312 within the circuit loop C1 is R1.

Figure 8:
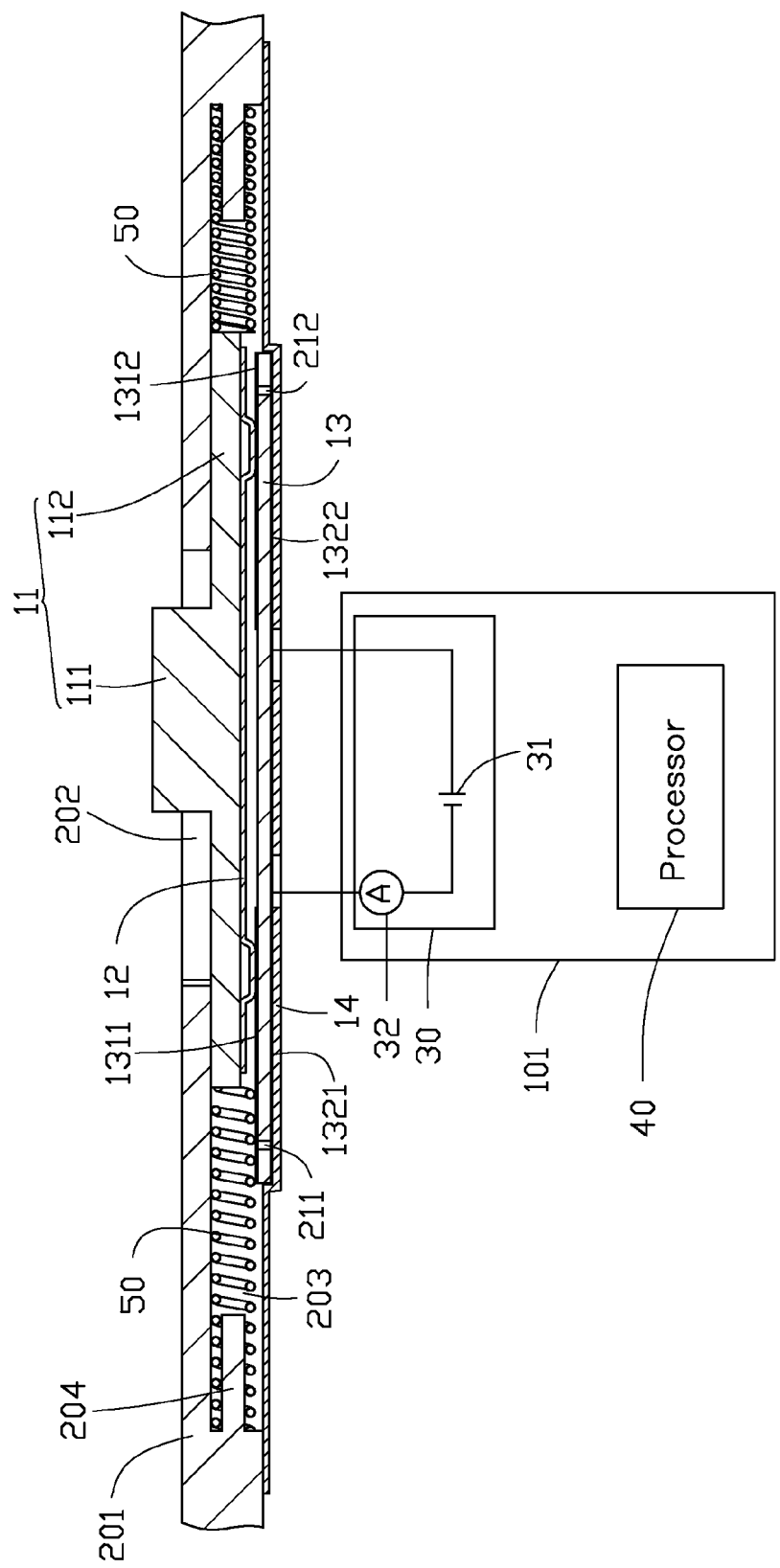
FIG. 8 is a diagrammatic view showing a key member of a multifunction key moved to a second position.

FIG. 8 illustrates when the key member 11 moves toward the second conductive hole 212 for a half of the maximum distance, namely, the key member 11 is pushed toward right for L/2, the distance between the second protrusion member 122 of the key member 11 and the second conductive hole 212 is L2 as shown in FIG. 8, and the resistance value of the resistance layer 1312 within the circuit loop C1 is R2.

Figure 9:
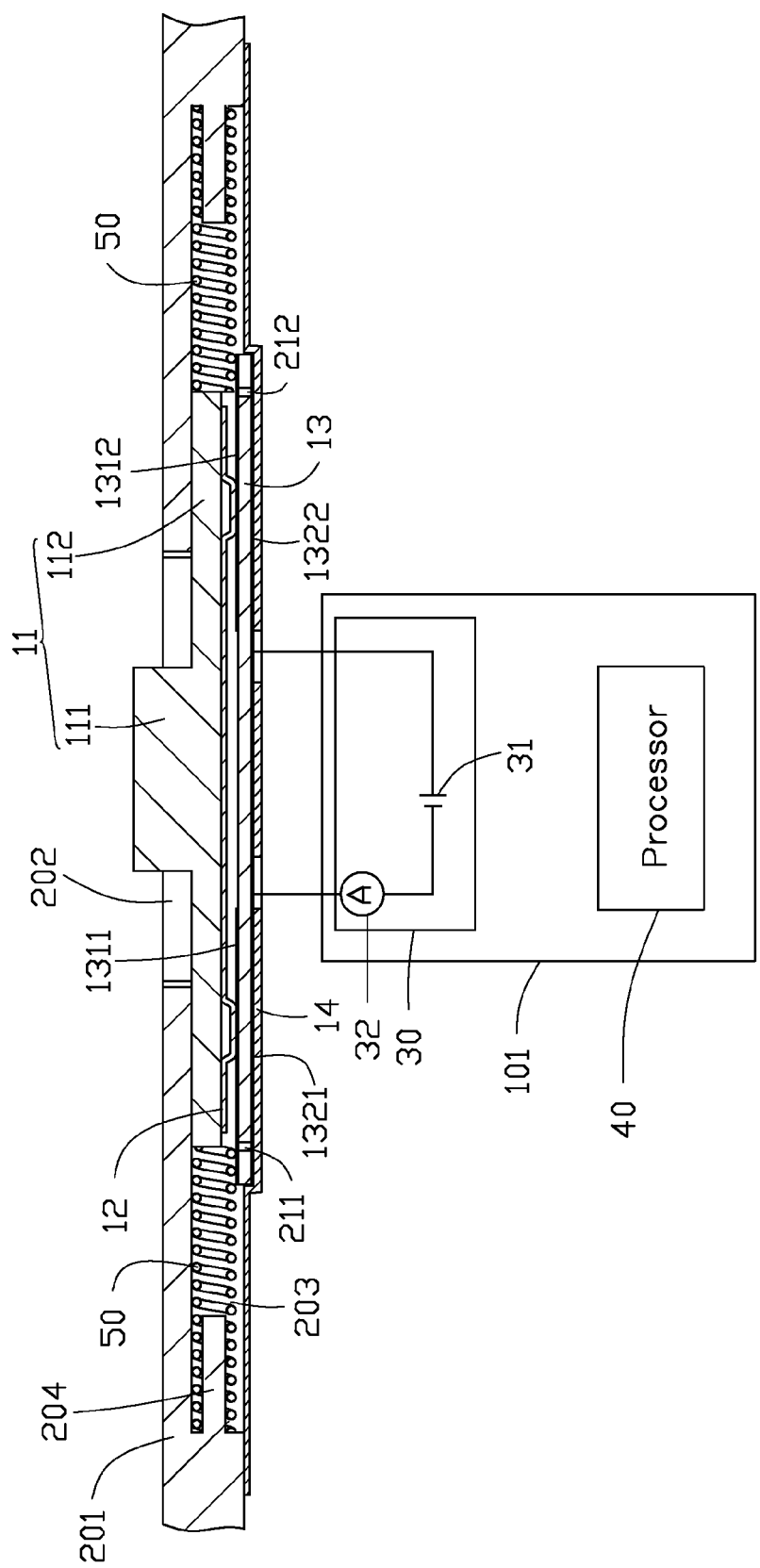
FIG. 9 is a diagrammatic view showing a key member of a multifunction key moved to a third position.

FIG. 9 illustrates when the key member 11 is at the initial position, the distance between the second protrusion member 122 of the key member 11 and the second conductive hole 212 is L3 as shown in FIG. 9, and the resistance value of the resistance layer 1312 within the circuit loop C1 is R3.

Figure 10:
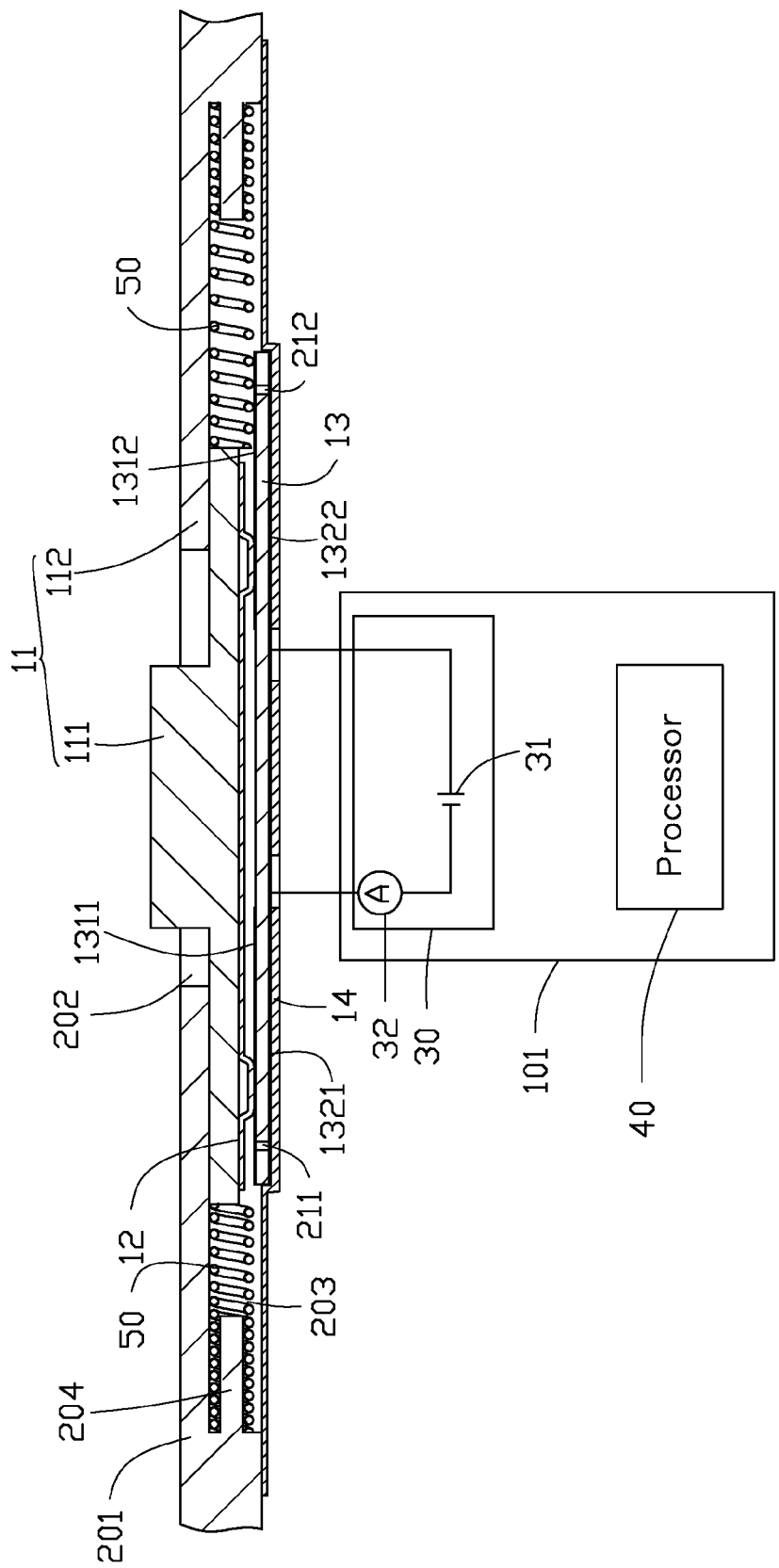
FIG. 10 is a diagrammatic view showing a key member of a multifunction key moved to a fourth position.

FIG. 10 illustrates when the key member 11 moves toward the first conductive hole 211 (namely, moves to the left, as shown in FIG. 10) for a half of the maximum distance L, namely, the key member 11 is pushed to left for L/2, the distance between the second protrusion member 122 of the key member 11 and the second conductive hole 212 is L4 as shown in FIG. 10, and the resistance value of the resistance layer 1312 within the circuit loop C1 is R4.

Figure 11:
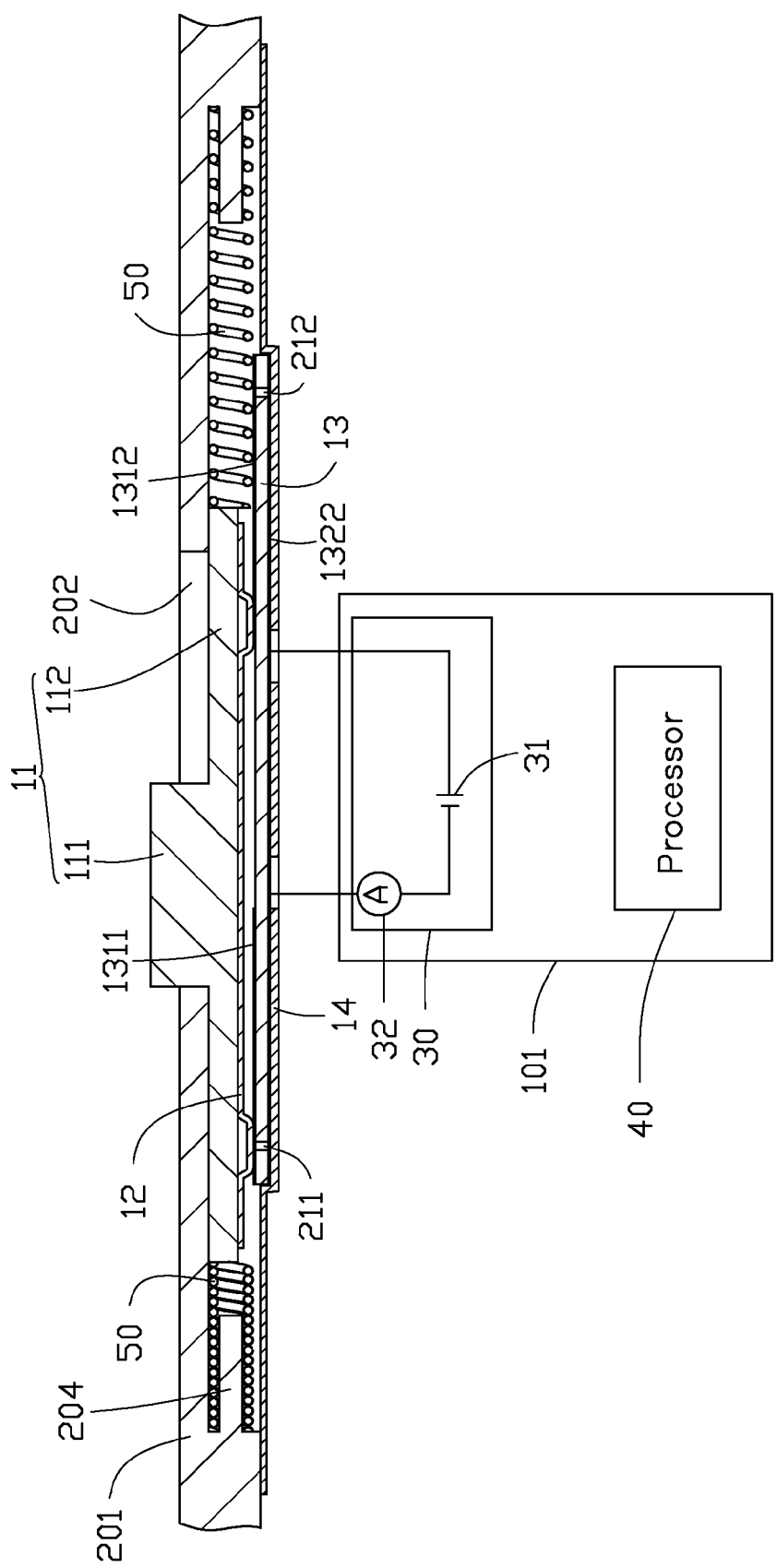
FIG. 11 is a diagrammatic view showing a key member of a multifunction key moved to a fifth position.

FIG. 11 illustrates when the key member 11 moves to the left for the maximum distance L, namely, the key member is pushed to the end toward left, the distance between the second protrusion member 122 of the key member 11 and the second conductive hole 212 is L5 as shown in FIG. 10, and the resistance value of the resistance layer 1312 within the circuit loop C1 is R5.

Therefore, as described above, a relationship is obtained as: L1<L2<L3<L4<L5. Because the resistance value is preferably proportion with the length, another relationship is obtained as: R1<R2<R3<R4<R5.

In one embodiment, the first predetermined resistance value Ra is equal to (R1+R2)/2, the second predetermined resistance value Rb is equal to (R2+R3)/2, the third predetermined resistance value Rc is equal to (R3+R4)/2, and the fourth predetermined resistance value Rd is equal to (R4+R5)/2.

Figure 12:
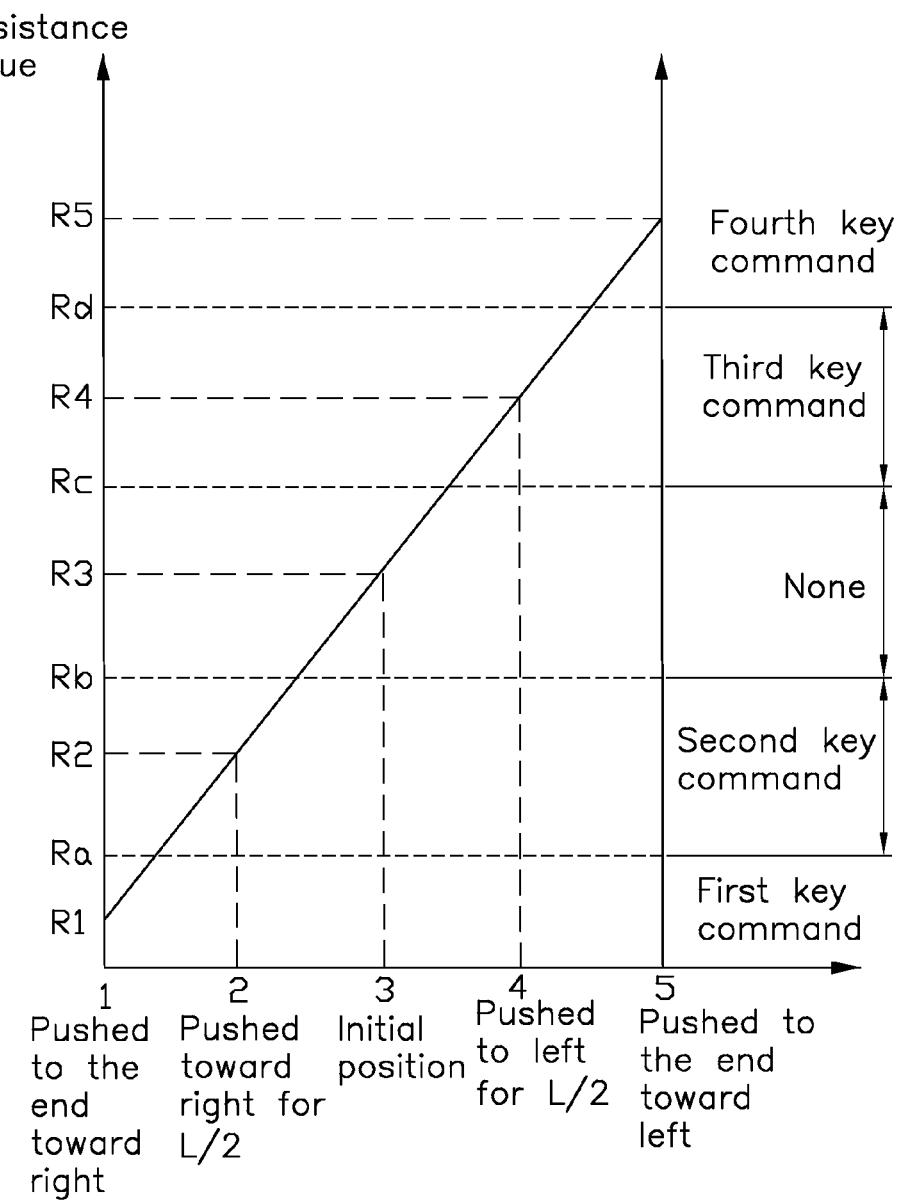
FIG. 12 is a graph showing relationships between positions of the key member and resistance values of a circuit loop, and key commands.

FIG. 12 illustrates relationships between positions of the key member and resistance values of the circuit loop C1, and corresponding key commands. FIG. 12 illustrates when the key member 11 moves to the right for the maximum distance L, the resistance value R of the resistance layer 1312 within the circuit loop C1 is less than Ra, namely, R<Ra=(R1+R2)/2. When the key member 11 moves to the right for a half of the maximum distance, the resistance value R of the resistance layer 1312 within the circuit loop C1 satisfies a relationship: Ra≤R<Rb, namely, (R1+R2)/2≤R<(R2+R3)/2. When the key member 11 is substantially at the initial position, the resistance value R of the resistance layer 1312 within the circuit loop C1 satisfies a relationship: Rb≤R<Rc, namely, (R2+R3)/2 R<(R3+R4)/2. When the key member 11 moves left for a half of the maximum distance, the resistance value R of the resistance layer 1312 within the circuit loop C1 satisfies a relationship: Rc≤R<Rd, namely, (R3+R4)/2≤R<(R4+R5)/2. When the key member 11 moves left for the maximum distance, the resistance value R of the resistance layer 1312 within the circuit loop C1 satisfies a relationship: Rd≤R, namely, (R4+R5)/2≤R.

As described above, when the processor 40 calculates the resistance value R of the circuit loop C1 according to Ohms law, the processor 40 then determines which resistance value range the determined resistance value R is within, and determines the key command corresponding to the determined resistance value range according to the resistance value range and key command relationship table, and executes the key command.

In one embodiment, the processor 40 determines which resistance value range that the calculated resistance value R is within only when a maintaining time of the calculated resistance value R is greater than a predetermined time, such as 1 second. For example, when the processor 40 calculates the resistance value R of the circuit loop C1 is 10 ohms, and the resistance value R of the circuit loop C1 is maintained to 10 ohms for 1 second, then the processor 40 determines which resistance value range that the calculated resistance value R is within and determines the key command corresponding to the determined resistance value range, and executes the key command.

In one embodiment, the first, second, third, fourth key command can be different when different applications are running on the electronic device 100. For example, when a music player is running, the first key command can be "previous song", the second key command can be "rewind", the third key command can be "fast forward", the fourth key command can be "next song". When viewing an electronic book or webpage via corresponding applications, the first key command can be "home page", the second key command can be "previous page", the third key command can be "next page", the fourth key command can be "end", etc.

Obviously, the first, second, third, and fourth key commands can be predefined in default or according to user operations.

FIGS. 2 and 6 illustrate the key 10 further includes a cover member 14, the cover member 14 is fixed on the second surface 132 of the circuit baseboard 13, and is further extended to an inner surface (not labeled) of the sidewall 201 and fixed on the inner surface of the sidewall 201, thus limiting the key 10 in the sidewall 201. In the embodiment, positions of the cover member 14 corresponding to the second end 1352 of the first conductive terminal 1321 and the second end 1362 of the second conductive terminal 1322 respectively set one opening hole 141. The power supply and detection unit 30 is connected to the second end 1352 of the first conductive terminal 1321 and the second end 1362 of the second conductive terminal 1322 via the opening holes 141.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the present disclosure.

What is claimed is:
1. A multifunction key comprising:
   a key member, wherein, a portion of the key member is to be exposed on an outside of a shell of an electronic device;
   a conductive member fixed on a bottom of the key member, wherein the conductive member comprises a first protrusion member and a second protrusion member extending toward a direction away from the bottom of the key member;
   a circuit baseboard comprising a first surface and a second surface opposite to the first surface, wherein, the first surface comprises a first conductive layer and a resistance layer which are isolated with each other, the first surface faces the conductive member, the first conductive layer and the resistance layer are respectively electrically connected to the first protrusion member and the second protrusion member; the second surface comprises a first conductive terminal and a second conductive terminal, a first end of the first conductive terminal is electrically connected to the conductive layer via a first conductive hole passing through the circuit baseboard, a first end of the second conductive terminal is electrically connected to the resistance layer via a second conductive hole passing through the circuit baseboard, a second end of the first conductive terminal and a second end of the second conductive terminal are to be electrically connected to an internal circuit of the electronic device;
   wherein, the conductive layer, and the resistance layer are configured to form a circuit loop with the internal circuit of the electronic device via the first conductive terminal, the second conductive terminal, the first conductive hole, the second conductive hole, and the conductive member; when the key member moves along a direction of arrangement of the conductive layer and the resistance layer, a distance between the second protrusion member and the second conductive hole is changed, a length of the resistance layer between the second protrusion member and the second conductive hole is changed too, and the resistance value of the resistance layer within the circuit loop is changed too, thus to cause the internal circuit of the electronic device to produce different key commands corresponding to different resistance values of the resistance layer within the circuit loop.

2. The multifunction key according to claim 1, wherein the conductive layer, the first conductive terminal, the second conductive terminal, the first conductive hole, the second conductive hole, and the conductive member are all made of materials with high conductivity, the resistance layer is made of materials with low conductivity, the circuit baseboard is made of insulating material, and the resistance value of the resistance layer within the circuit loop is substantially the same as a resistance value of the circuit loop.

3. The multifunction key according to claim 2, wherein the conductive layer is a first coating coated on a substantially half area of the first surface of the circuit baseboard, and the resistance layer is a second coating coated on another substantially half area of the first surface of the circuit baseboard, and a portion of the first surface between the conductive layer and the resistance layer is not coated the conductive layer and the resistance layer.

4. The multifunction key according to claim 2, further comprising a cover member, wherein the cover member is fixed on the second surface of the circuit baseboard, and is further extended to an inner surface of the sidewall and fixed on the inner surface of the sidewall, thus to limit the key in the sidewall.

5. The multifunction key according to claim 4, wherein positions of the cover member corresponding to the second end of the first conductive terminal and the second end of the second conductive terminal respectively set one opening hole, the second end of the first conductive terminal and the second end of the second conductive terminal are connected to the internal circuit via the opening holes.

6. An electronic device comprising:
a power supply and detection unit;
a processor connected to the power supply and detection unit;
a shell; and
a multifunction key setting on a sidewall of the shell, the multifunction key comprising:
a key member, wherein a portion of the key member is exposed on an outside of the shell;
a conductive member fixed on a bottom of the key member, wherein the conductive member comprises a first protrusion member and a second protrusion member extending toward a direction away from the bottom of the key member;
a circuit baseboard comprising a first surface and a second surface opposite to the first surface, wherein, the first surface comprises a first conductive layer and a resistance layer which are isolated with each other, the first surface faces the conductive member, the first conductive layer and the resistance layer are respectively electrically contacted to the first protrusion member and the second protrusion member; the second surface comprises a first conductive terminal and a second conductive terminal, a first end of the first conductive terminal is electrically connected to the conductive layer via a first conductive hole passing through the circuit baseboard, a first end of the second conductive terminal is electrically connected to the resistance layer via a second conductive hole passing through the circuit baseboard, a second end of the first conductive terminal and a second end of the second conductive terminal are electrically connected to the power supply and detection unit;
wherein, the conductive layer, and the resistance layer, and the power supply and detection unit form a circuit loop via the first conductive terminal, the second conductive terminal, the first conductive hole, the second conductive hole, and the conductive member; when the key member moves along a direction of arrangement of the conductive layer and the resistance layer, a distance between the second protrusion member and the second conductive hole is changed, a length of the resistance layer between the second protrusion member and the second conductive hole is changed too, and the resistance value of the resistance layer within the circuit loop is changed too;
wherein, the power supply and detection unit is configured to provide a predetermined voltage to the circuit loop and detect a current value of the circuit loop;
the processor is configured to calculate the resistance value according to the predetermined voltage and the detected current value, determine a key command corresponding to the resistance value, and execute the corresponding key command.

7. The electronic device according to claim 6, wherein the conductive layer, the first conductive terminal, the second conductive terminal, the first conductive hole, the second conductive hole, and the conductive member are all made of materials with high conductivity, the resistance layer is made of materials with low conductivity, the circuit baseboard is made of insulating material, and the resistance value of the resistance layer within the circuit loop is substantially the same as a resistance value of the circuit loop.

8. The electronic device according to claim 7, wherein the processor determines a resistance value range that the resistance value of the circuit loop within, and determines the key command corresponding to the determined resistance value range, according to a resistance value range and key command relationship table; the resistance value range and key command relationship table records relationships between a plurality of resistance value ranges and a plurality of key commands, when the resistance value is less than a first predetermined resistance value, the corresponding key command is a first key command, when the resistance value is not less than the first predetermined resistance value and less than a second predetermined resistance value, the corresponding key command is a second key command, when the resistance value is not less than the second predetermined resistance value and less than a third predetermined resistance value, the corresponding key command is none, when the resistance value is not less than the third predetermined resistance value and less than a fourth predetermined resistance value, the corresponding key command is a third key command, when the resistance value is not less than the fourth predetermined resistance value, the corresponding key command is a fourth key command.

9. The electronic device according to claim 8, wherein the sidewall of the shell comprises an opening, and an inner sidewall of the opening has opened two receiving slots extending toward two opposite directions along a lengthwise direction of the sidewall of the shell.

10. The electronic device according to claim 9, wherein the key member comprises a keycap and a base body fixed to each other, the base body is shaped as rectangle and two ends of the base body respectively are received in the two receiving slots, the keycap is fixed on a center of the base body and is extended out from the opening, the conductive member is fixed on a bottom of the base body, a size of the keycap is less than the that of the opening, and a length of the base body is less than a total length of the two receiving slots; when the keycap is not operated by the user, the key member is located at a center of the opening as an initial position; when the keycap is operated by the user, the keycap brings the base body to move in the two receiving slots, thus to bring the conductive member to move to different positions along the lengthwise direction of the sidewall of the shell.

11. The electronic device according to claim 10, wherein the first predetermined resistance value is equal to (R1+R2)/2, the second predetermined resistance value is equal to (R2+R3)/2, the third predetermined resistance value is equal to (R3+R4)/2, and the fourth predetermined resistance value is equal to (R4+R5)/2; R1 is the resistance value of the resistance layer within the circuit loop when the key member is pushed to move from the initial position toward the second conductive hole for a maximum distance; R2 is the resistance value of the resistance layer within the circuit loop when the key member is pushed to move toward the second conductive hole for or a half of the maximum distance, R3 is the resistance value of the resistance layer within the circuit loop when the key member is located at the initial position; R4 is the resistance value of the resistance layer within the circuit loop when the key member is pushed to move toward the first conductive hole for or a half of the maximum distance; and R5 is the resistance value of the resistance layer within the circuit loop when the key member is pushed to move toward the first conductive hole for the maximum distance.

12. The electronic device according to claim 10, further comprising two elastic members respectively received in the two receiving slots, wherein, each elastic member is set between one corresponding end of the base body and a bottom of one corresponding receiving slot, when the key member does not be operated by the user, the two elastic members does not produce elastic forces or produce the same elastic forces, thus causing the key member to retain at the initial position, when the key member moves along the lengthwise direction of the sidewall in response to user operations, one elastic member is depressed and another elastic member is stretched, when the key member stops being operated by the user, the two elastic members produce corresponding elastic forces to force the key member to resume the initial position.

13. The electronic device according to claim 8, wherein the processor determines which resistance value range that the resistance value calculated by it is within and determines the corresponding key command only when a maintaining time of the resistance value calculated by it is greater than a predetermined time.

14. The electronic device according to claim 6, wherein the key further comprising a cover member, wherein the cover member is fixed on the second surface of the circuit baseboard, and is further extended to an inner surface of the sidewall and fixed on the inner surface of the sidewall, thus to limit the key in the sidewall.

15. The electronic device according to claim 14, wherein positions of the cover member corresponding to the second end of the first conductive terminal and the second end of the second conductive terminal respectively set one opening hole, the second end of the first conductive terminal and the second end of the second conductive terminal are connected to the internal circuit via the opening holes.

* * * * *